United States Patent

Sabounchi et al.

[19]

[11] Patent Number: 6,069,480
[45] Date of Patent: May 30, 2000

[54] KELVIN CONTACT-TYPE TESTING DEVICE

[75] Inventors: Farid J. Sabounchi, Arlington; Martin Rowan, Roanoke; Kurt Schultz, Arlington, all of Tex.

[73] Assignee: Aetrium-FSA, LP, Grand Prairie, Tex.

[21] Appl. No.: 09/001,299

[22] Filed: Dec. 31, 1997

[51] Int. Cl.[7] .................................................. G01R 31/28
[52] U.S. Cl. ........................................... 324/754; 324/758
[58] Field of Search ..................................... 324/754, 755, 324/758, 760, 158.1, 757, 761, 537

[56] References Cited

U.S. PATENT DOCUMENTS

| | | |
|---|---|---|
| 4,047,780 | 9/1977 | Cedrone . |
| 4,308,498 | 12/1981 | Madajewski et al. .................. 324/757 |
| 4,316,231 | 2/1982 | Michel .................................... 361/212 |
| 4,410,227 | 10/1983 | Prunella et al. ....................... 439/296 |
| 4,419,626 | 12/1983 | Cedrone et al. ....................... 324/761 |
| 4,747,784 | 5/1988 | Cedrone ................................. 439/71 |
| 4,866,374 | 9/1989 | Cedrone ................................. 324/537 |
| 4,956,604 | 9/1990 | Cedrone ................................. 324/754 |
| 5,521,521 | 5/1996 | Perego ................................... 324/755 |
| 5,731,709 | 3/1998 | Pastore et al. . |

*Primary Examiner*—Josie Ballato
*Assistant Examiner*—T. R. Sundaram
*Attorney, Agent, or Firm*—Alan Kamrath Oppenheimer Wolff & Donnelly LLP

[57] ABSTRACT

A device (10) for testing miniature electronic components (104) includes a pair of contacts (88, 90), each of which is adapted to engage a common side (121) of a lead (110) of the electronic component (104) to be tested at longitudinally spaced locations. In particular, each contact (88, 90) includes an end portion (95, 99) that is arranged at an angle to both the lead (110) and the other contact (88, 90), while extending in a common vertical plane with the other contact (88, 90). In a preferred form of the invention, the device (10) includes a base (46) to which the first and second contacts (88, 90) are mounted. Each of the contacts (88, 90) include first and second end portions (94, 95 and 98, 99), with the first end portion (94, 98) of each contact (88, 90) being fixed relative to the base (46) and the second end portion (95, 99) extending at an angle to a plane of the base (46). In the most preferred form, the first end portion (94) of the first contact (88) is mounted atop the base (46) and the second end portion (95) thereof slopes downward from the base (46). On the other hand, the second end portion (99) of the second contact (90) is mounted below the first contact (88), such as on the bottom of the base (46), and the second end portion (99) thereof projects upwardly, at an acute angle to the vertical, to a point located above the second end portion (95) of the first contact (88). To accommodate the testing of electronic components (104) having varying lead spans, the base (46) can be formed from multiple, relatively shiftable sections (46a, 46b), each of which carries a respective pair of contact (88, 90).

25 Claims, 3 Drawing Sheets

KELVIN CONTACT-TYPE TESTING DEVICE

BACKGROUND OF THE INVENTION

1. Field of the Invention

The present invention pertains to the art of testing devices for miniature electronic components and, more particularly, to a contact arrangement incorporated in a Kelvin testing device.

2. Discussion of the Prior Art

It is common practice to test the performance characteristics of miniature electronic components, such as semiconductors, prior to mounting of the components in electronic devices. For this purpose, leads of the miniature electronic components are electrically connected to a testing apparatus which generally applies a predetermined test current across respective lead pairs and measures a voltage drop associated with the component. The voltage drop is then compared to a predetermined specification in order to verify the quality of the component. Therefore, in order to test such miniature electronic components, the leads are engaged with contacts of the testing device in order to deliver the desired test current In such a testing device, a varying resistance can be created between the leads of the component being tested and the contacts of the testing device which can distort the measured voltage drop, particularly when components requiring relatively large currents are being tested. To avoid such testing errors, the use of Kelvin-type contacts have become widely accepted in the art.

In general, Kelvin contacts are arranged in sets, each of which includes a current supply contact and a voltage transmitting contact. More specifically, the current supply or "forcing" contact is adapted to engage one part of a lead of an electronic component to be tested while the voltage transmitting or "sensing" contact also engages the same lead. With such an arrangement, the sensing contacts receive a very small flow of current and therefore the voltage drop due to contact resistance is minimal, thereby enabling an accurate test reading.

Kelvin contact-type testing devices known in the art generally take two forms. In one form, the testing lead is pressed between the forcing and sensing contacts. More specifically, the electronic component to be tested is placed within a Kelvin testing device with each lead initially engaging a lower testing contact and then a unit is activated to shift a movable portion of the testing device such that an upper Kelvin contact engages the same lead, with the lead being clamped between the upper and lower Kelvin contacts. Obviously, such a testing arrangement requires additional time for actuation of the clamping arrangement such that testing of the electronic components in this fashion is rather time consuming and significantly slows down production. This particular type of testing device also suffers from the need to have a precise alignment of the electronic component within the testing device or else damage can be done to one or more of the leads and/or contacts during the clamping operation.

A second type of known Kelvin contact-type testing device positions the forcing and sensing contacts in a slightly spaced, side-by-side arrangement, thereby locating the contacts in a common, generally horizontal plane. In accordance with this type of testing arrangement, an electronic component need merely be brought vertically into engagement with the adjacent Kelvin contacts, with each of the contacts engaging a single side of a respective lead of the electronic component Although this style of testing device avoids the potential for damage due to any clamping action, even higher degrees of precision alignment must be established to assure a good engagement between the lead and the contacts. However, the leads on various miniature electronic components, such as many semiconductors, are so small in width that utilizing Kelvin contacts arranged side-by-side is not feasible.

SUMMARY OF THE INVENTION

The present invention solves these and other deficiencies and problems associated with known Kelvin contact-type testing devices by providing a device for testing miniature electronic components having multiple contacts, each of which is adapted to engage a common side of a lead of the electronic component at longitudinally spaced locations. In particular, the testing device incorporates a pair of contacts for engaging each lead of a miniature electronic component to be tested, with each contact having an end portion that is arranged at an angle to both the lead and the other contact, while extending in a common plane, which is generally parallel to a direction of insertion of the electronic component into the testing device, with the other contact.

In a preferred form of the invention, the device includes a base to which first and second contacts, that are adapted to engage a single lead of a miniature electronic component to be tested, are mounted. Each of the contacts includes first and second end portions, with the first end portion of each contact being fixed relative to the base and the second end portion extending at a non-linear angle to a plane of the base. In the most preferred form, the first end portion of the first contact is mounted atop the base and the second end portion thereof slopes downward from the base. On the other hand, the first end portion of the second contact is mounted below the first contact, such as on the bottom of the base, and the second end portion thereof projects upwardly, preferably above the second end portion of the first contact. In addition, the first and second contacts extend in a common vertical plane such that a lead of the miniature electronic component to be tested can be engaged at spaced longitudinal positions along the length of a lower side of the lead. When used in testing electronic components having varying lead spans, the base of the testing device is formed of multiple sections which can be selectively shifted relative to one another, with each of the sections being provided with sets of first and second contacts for engaging respective electronic component leads.

In any event, by arranging the first and second contacts in a common vertical plane, i.e. a plane generally parallel to a direction of insertion of the electronic component into the testing device, and angling each of the second end portions of the contacts relative to the base and each other in the manner discussed above, both of the contacts can engage a single side of the lead at spaced longitudinal positions, while avoiding any damage to the lead and minimizing the need for any precision alignment between the contacts and the lead. With this arrangement, the testing device of the present invention has been found to provide accurate test results, while minimizing required testing times.

It is thus an object of the present invention to provide a device for testing miniature electronic components having an improved contact arrangement for engaging each lead of an electronic component to be tested.

It is another object of the present invention to provide an electronic component testing device which incorporates a pair of contacts that are adapted to engage a single side surface of a lead of the electronic component at spaced longitudinal positions.

It is a further object of the present invention to provide a testing device having sets of contacts, with each set including a pair of contacts having end portions which are angled relative to each other and a lead to be tested.

It is a still further object of the present invention to provide a testing device that can be easily adjusted for use in testing miniature electronic components having varying lead spans.

Additional objects, features and advantages of the testing device of the present invention will become more readily apparent from the following detailed description of the preferred embodiment thereof when taken in conjunction with the drawings wherein like reference numerals refer to corresponding parts in the several views.

Figure 1:
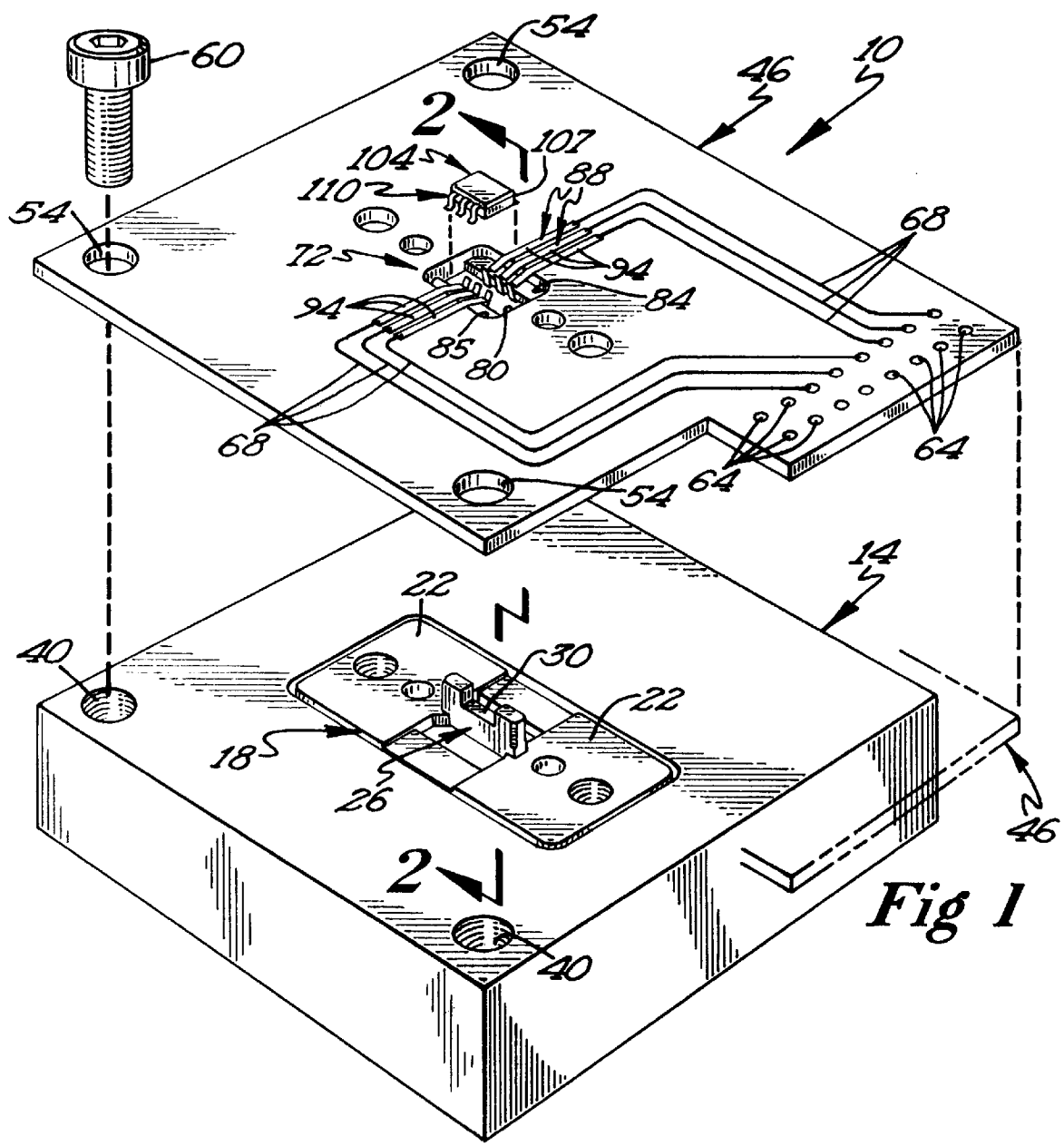
FIG. 1 is an exploded perspective view of a testing device constructed in accordance with the present invention.

At this point, it should be noted that all of the figures are drawn for ease of explanation of the basic teachings of the present invention only; extension of the figures with respect to the number, position, relationship and dimension of the parts to form the preferred embodiment will be within the skill of the art after the following teachings of the present invention have been read and understood. Further, the exact dimensions and dimensional proportions to conform to specific force, weight, strength and similar requirements will likewise be within the skill of the art after the following teachings of the present invention have been read and understood.

Furthermore, when the terms "top", "bottom", "first", "second", "lower", "upper", "upwardly", "downwardly", "vertical", "horizontal", and similar terms are used herein, it should be understood that these terms have reference only to the structure shown in the drawings as it would appear to a person viewing the drawings and are utilized only to facilitate describing the invention.

DETAILED DESCRIPTION OF THE PREFERRED EMBODIMENT

A device for testing miniature electronic components having multiple connection leads according to the teachings of the present invention is shown in the drawings and designated 10. Testing device 10 generally includes a mounting block 14 having secured thereto, in an electrically isolated manner, a central component alignment unit 18. Alignment unit 18 preferably takes the form of a plate 22 and is provided with an upstanding member 26 having a central cut-out zone 30. Mounting block 14 is provided with a plurality of spaced, threaded apertures 40 for use in mounting a testing base 46 thereto. As clearly shown in these drawings, testing base 46 preferably constitutes a printed, electrically insulated circuit board formed with various spaced holes 54 that are adapted to be aligned with apertures 40 in order to receive screws 60 for securing base 46 to mounting block 14.

In a manner known in the art, base 46 is formed with a plurality of connector attachment holes 64 from which extend multiple circuit lines 68 leading to a central testing zone 72 formed in base 46. Although not shown in these drawings, for the sake of simplicity, circuit lines 68 preferably extend along both the top and bottom surface portions of base 46.

Central testing zone 72 includes an elongated, central slot 80, as well as opposed notched or grooved portions 84 and 85. Slot 80 is sized so as to enable upstanding member 26 to project therein following the positioning of base 46 upon mounting block 14. Projecting into central slot 80 and electrically connected to a respective circuit line 68 are first or upper contacts 88, as well as second or lower contacts 90. More specifically, upper and lower contacts 88 and 90 are arranged in respective, electrically isolated pairs and each upper contact 88 includes a first end portion 94, which is affixed atop base 46 and electrically connected to a respective circuit line 68, and a second end portion 95 that is cantilevered from first end portion 94 and projects into central testing zone 72. In a similar manner, each lower contact 90 includes a first end portion 98 that is fixed relative to base 46 and electrically connected to a respective circuit line 68, and a second end portion 99 that is cantilevered from first end portion 98 and projects into central testing zone 72.

As indicated above, the upper and lower contacts 88 and 90 are arranged as pairs located in a common vertical plane within central testing zone 72. More particularly, in accordance with the most preferred form of the invention, second end portion 95 of upper contact 88 slopes downwardly relative to both base 46 and first end portion 94. This downwardly sloping configuration is readily accommodated due to the presence of a respective notched or grooved portion 84 or 85. On the other hand, first end portion 98 of second contact 90 is arranged vertically below upper contact 88 on base 46 and second end portion 99 projects upwardly and inwardly into central testing zone 72. In the most preferred form of the invention, second end portion 99 projects upwardly at an acute angle to a vertical plane and extends above the inner most tip of second end portion 95 of upper contact 88. With this arrangement, the second end portions 95 and 99 of upper and lower contacts 88 and 90 are cantilevered and extend in respective intersecting longitudinal axes, both of which are arranged at an angle to a plane defined by base 46. At the same time, the upper and lower contacts 88 and 90 are located in a common vertical plane.

As mentioned above, device 10 is adapted for testing miniature electronic components, such as a semiconductor indicated at 104. As shown, semiconductor 104 includes a body 107 and a plurality of leads 110, with each lead 110 including a first leg section 114 and a second leg section 116, with first leg section 114 extending generally vertically and second leg section 116 extending generally horizontally. Each lead 110 has a length associated with longitudinally extending, opposing first and second lead sides 120 and 121 thereof. As upper and lower contacts 88 and 90 are already connected to respective circuit lines 68, testing of semiconductor 104 merely requires vertically positioning semiconductor 104 within central testing zone 72 such that each lead 110 will engage a respective set of upper and lower contacts 88 and 90. Of course, each of the circuit lines 68 are electrically connected to additional test circuitry for use in delivering a testing current and receiving a voltage drop output signal based on connections made at attachment holes 64. As these features arc not considered part of the present invention, they have not been shown in the drawings and will not be described herein.

An important aspect of the present invention is the manner in which the angling of contacts 88 and 90 enables engagement of a respective set of contacts with a single lower side surface 121 of a respective lead 110. Although the particular angling of second end portions 95 and 99 of upper and lower contacts 88 and 90 can vary depending upon the particular configuration and angling of leads 110, this general configuration for upper and lower contacts 88 and 90 advantageously enables the respective second end portions 95 and 99 to engage lower side surface 121 at spaced longitudinal locations, without the need for any auxiliary clamping equipment. More specifically, second end portion 95 of contact 88 will abut lower side surface 121 at second leg section 116, while second end portion 99 of contact 90 will abut lower side surface 121 at the junction of first and second leg sections 114 and 116 and/or simply along first leg section 114.

Preferably, second end portion 99 is adapted to engage first leg section 114 intermediate second leg section 116 and body 107. With the downward sloping of second end portion 95, second end portion 95 can readily deflect upon engagement with second leg section 116 so as to provide an upward biasing force on lead 110 as shown in FIG. 3, but will consistently return to its original, non-deflected position shown in FIG. 2 upon withdrawal of semiconductor 104. On the other hand, second end portion 99 provides a laterally outwardly directed biasing force upon first leg section 114 in the test position of FIG. 3, while consistently returning to the non-deflected position of FIG. 2. The biasing forces developed by second end portions 95 and 99 ensure a positive engagement between leads 110 and contacts 88 and 90 when semiconductor 104 is shifted from the position generally shown in FIG. 2 to the testing position shown in FIG. 3 by a mechanical handler (not shown.)

Since each set of upper and lower contacts 88 and 90 are located in a common vertical plane, i.e. in a plane generally parallel to a direction of insertion of semiconductor 104 into central testing zone 72, alignment of one of the contacts will advantageously provide for alignment of the other. By extending second end portion 99 of lower contact 90 above second end portion 95 of upper contact 88 and arranging second end portion 99 within central testing zone 72, a positive engagement between second end portion 99 and lead 10 is assured. This arrangement also aids in laterally positioning semiconductor 104, particularly due to the biasing forces acting on the first leg sections 114 by the various second end portions 99 as mentioned above. Longitudinal shifting of semiconductor 104 is prevented due to the fact that central cut-out zone 30 of upstanding member 26 is sized to receive body 107 of semiconductor 104, while positioning semiconductor 104 to ensure proper engagement between the contacts 88 and 90 and the leads 110. In addition, the depth of cut-out zone 30 governs the permissible degree of insertion of semiconductor 104 into testing device 10.

Based on the above, it should be readily apparent that the testing device of the present invention provides an easy and accurate way of assuring quality testing of miniature electronic components without creating the potential for damaging the component during testing. The configuration of the contacts 88 and 90 assures a positive connection with the leads 110 of a semiconductor 104 being tested and also aids in aligning the semiconductor 104 within the central testing zone 72 of device 10. Since each set of contacts 88 and 90 engages a single lead 110 upon the insertion of semiconductor 104 within central testing zone 72, there is no need for additional clamping structure such that the time needed for testing semiconductor 104 can be minimized to increase production rates.

Figure 4:
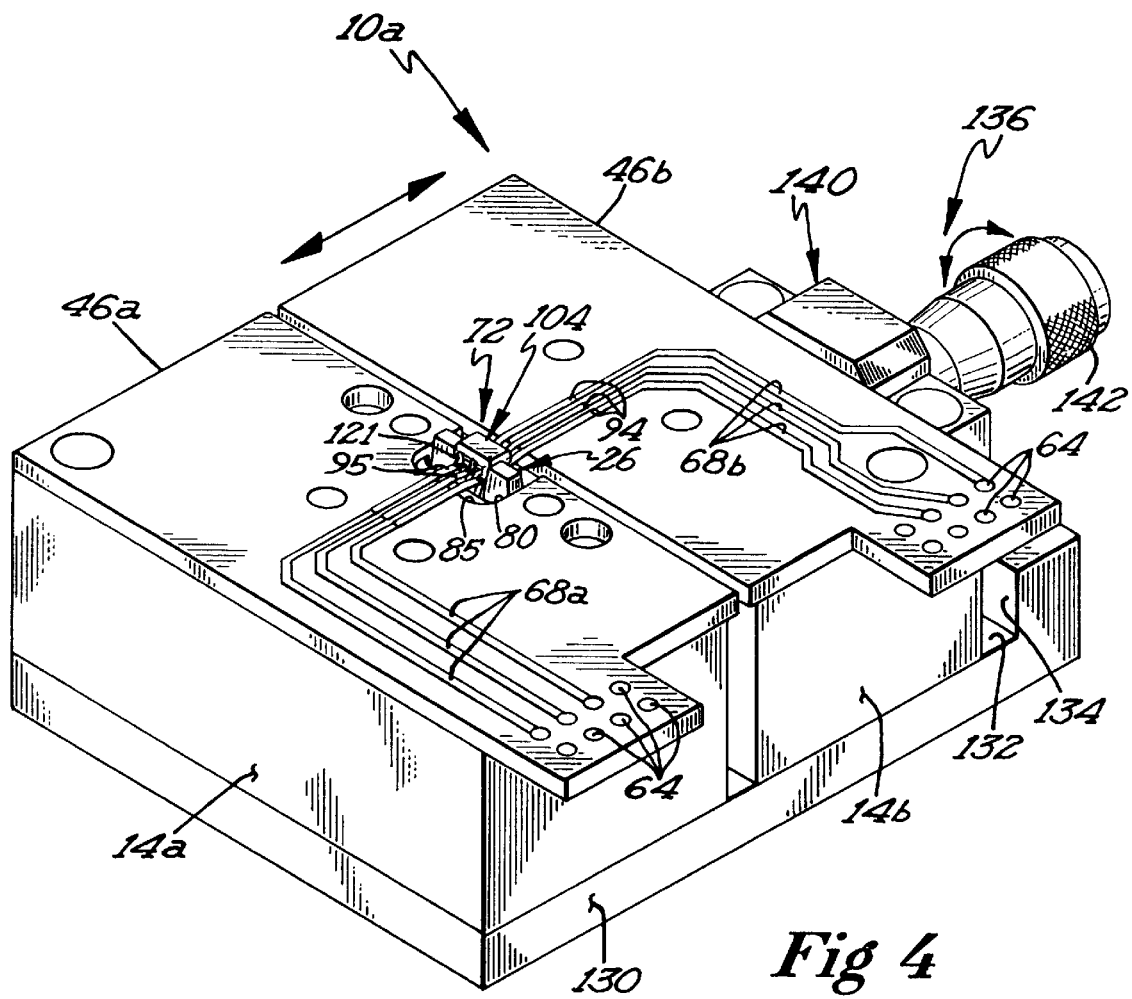
FIG. 4 is a perspective view of a modified form of the testing device of FIGS. 1–3.

If the testing device of the present invention is to be utilized in testing electronic components having variable lead spans, a few desirable modifications to the device described above is provided. As shown in the embodiment of FIG. 4, testing device 10a includes a base that is formed from first and second base sections 46a and 46b, with each base section 46a and 46b carrying respective circuit lines 68a and 68b. As shown, base section 46a extends about three sides of the central testing zone 72. Central testing zone 72 is constructed identical to that set forth above and therefore details thereof need not be reiterated here. In the preferred form shown, first base section 46a is affixed atop a first mounting block portion 14a and second base section 46b is affixed atop a second mounting block portion 14b. Both mounting blocks portions 14a and 14b are positioned upon a support 130. More specifically, mounting block portion 14a is preferably fixed to a planar support surface 132 of support 130 and mounting block portion 14b is slidably mounted on planar support surface 132.

Figure 2:
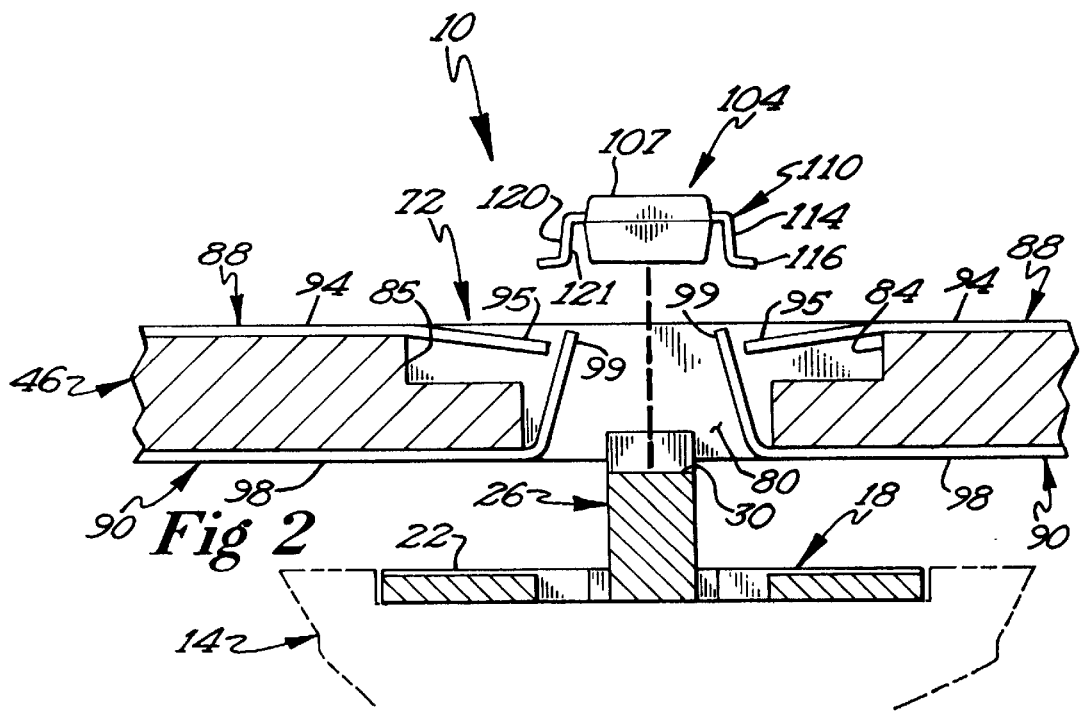
FIG. 2 is an enlarged exploded, elevational view, partially in cross-section, of a central portion of the testing device of FIG. 1.
Figure 3:
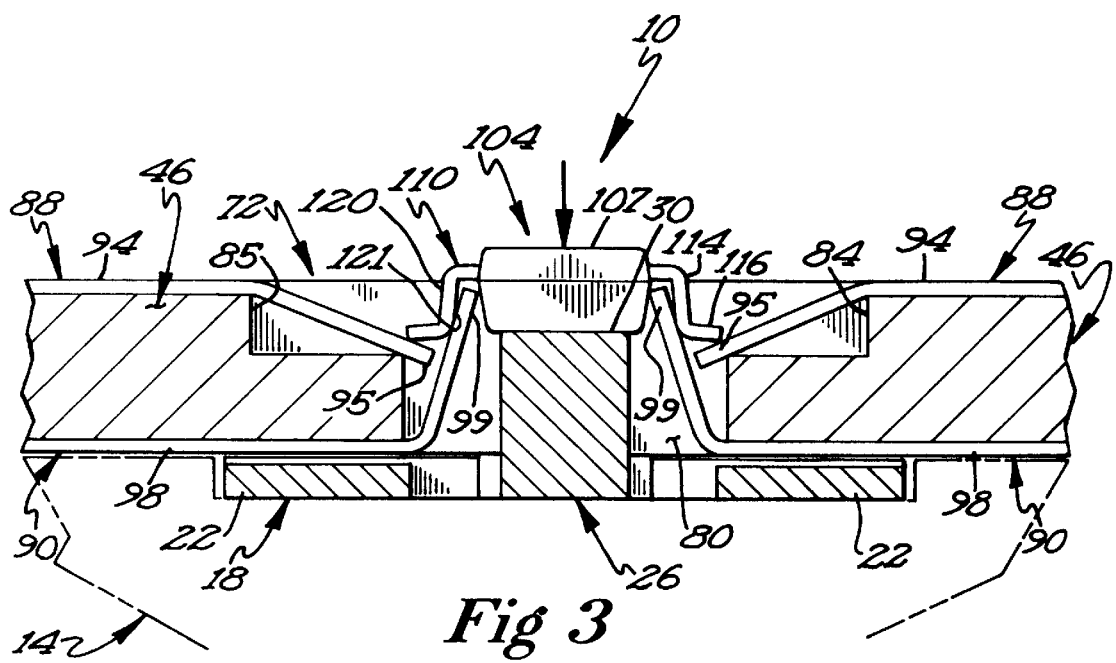
FIG. 3 is a cross-sectional side view of the testing device, similar to that of FIG. 2, in an in-use condition.

In a manner directly analogous to that depicted in FIGS. 2 and 3 for testing base 46, each of the base sections 46a and 46b carry respective sets of the first and second contacts 88 and 90. However, in accordance with this embodiment, since base section 46b is movable upon planar support surface 132 relative to first base section 46a, the distance between the contacts 88 and 90 carried by base section 46a and the contacts 88 and 90 carried by base section 46b can be adjusted in order that device 10a can be readily utilized to test electronic components having variable lead spans. Therefore, base section 46b can be shifted to an abutting relationship with base section 46a or can be shifted away therefrom in accordance with this preferred embodiment. The movement of base section 46b away from base section 46a is limited, at least due to the presence of an upstanding wall 134 formed as part of support 130.

In the most preferred form, second base section 46b is shifted relative to first base section 46a through the use of a micrometer unit 136 that is mechanically interconnected to mounting block portion 14b. In general, micrometer unit 136 functions in a manner known in the art to provide for fine linear adjustments. In general, micrometer unit 136 includes a bearing/bracket assembly 140 that is mounted to upstanding wall 134 of support 130 and includes a screw lead (not shown) that is threadably interconnected to mounting block portion 14b. Micrometer unit 136 incorporates a rotary knob 142 to enable both course and fine adjustments of the screw shaft and, correspondingly, the shifting of mounting block portion 14b. Once the desired position for second base section 46b is established, second base section 46b is preferably fixed to support 130, such as through the use of a set screw arrangement or the like (not shown).

Now that the basic teachings of the testing device according to the present invention have been set forth, it should be apparent that other variations will be obvious to persons skilled in the art. Thus the invention disclosed herein may be embodied in other specific forms without departing from the spirit or general characteristics thereof, some of which forms have been indicated, and the embodiment described herein should be considered in all respects illustrative and not restrictive. The scope of the invention is to be indicated by the appended claims, rather than by the foregoing description, and all changes which come within the meaning and range of equivalents of the claims are intended to be embraced therein.

What is claimed is:

1. A device for testing miniature electronic components having multiple connection leads, with each lead having an associated length defined by longitudinally extending, opposed first and second lead sides, comprising, in combination: a base extending in a base plane; a first contact having first and second end portions, with the first end portion being fixed relative to the base and the second end portion extending at an angle to the base plane and being adapted to engage the first lead side of an electronic component to be tested; and a second contact having first and second end portions, with the first end portion being fixed relative to the base and the second end portion extending at an angle to both the base plane and the second end portion of the first contact, while also being adapted to engage the first lead side of the electronic component to be tested as the electronic component is inserted in the testing device.

2. The device according to claim 1 wherein the second end portion of the first contact is angled in a first direction relative to the base plane and the second end portion of the second contact is angled in a second direction, different from the first direction, relative to the base plane.

3. The device according to claim 2 wherein the second end portion of the second contact extends upwardly at a vertically acute angle.

4. The device according to claim 1 further comprising, in combination: an elongated slot, adapted to receive the electronic component to be tested, extending through the base, with the first end portion of the first contact being affixed atop the base, the second end portion of the first contact extending into the elongated slot, the first portion of the second contact being mounted below the base, and the second end portion of the second contact projecting upwardly from below the first contact.

5. The device according to claim 4 further comprising, in combination: an alignment unit including an upstanding member formed with a central cut-out zone, with the upstanding member extending within the elongated slot to a height below the first end portion of the first contact, with a body of the electronic component being adapted to be received within the cut-out zone of the upstanding member upon insertion of the electronic component into the testing device.

6. The device according to claim 4 wherein the second end portion of the first contact slopes downward from the base.

7. The device according to claim 6 further comprising, in combination: a notch formed in the base into which the second end portion of the first contact extends.

8. The device according to claim 4 wherein the second end portion of the second contact projects upwardly above the second end portion of the first contact.

9. The device according to claim 1 wherein the second end portions of the first and second contacts extend in a common plane which is generally parallel to a direction of insertion of an electronic component to be tested into the testing device.

10. The device according to claim 1 wherein each lead includes a generally vertically extending first leg section and a terminal, generally horizontally extending second leg section, with the second end portion of the first contact being adapted to engage the second leg section of the lead and the second end portion of the second contact being adapted to engage the first leg section of the lead.

11. The device according to claim 1 wherein the base is formed from at least first and second base sections, with each of the first and second base sections having secured thereto a respective set of the first and second contacts, with the first base section being movable relative to the second base section to adjust a span between the respective sets of the first and second contacts to accommodate varying sized electronic components to be tested.

12. A device for testing miniature electronic components having multiple connection leads, with each lead having an associated length defined by longitudinally extending, opposing first and second lead sides, comprising, in combination: a base extending in a base plane; a first contact having first and second end portions, with the first end portion being affixed to the base and the second end portion being adapted to engage a lead of an electronic component to be tested at a first location along the length of the first lead side as the electronic component is inserted in the testing device; and a second contact having first and second end portions, with the first end portion of the second contact being affixed to the base and the second end portion of the second contact being adapted to engage the lead of the electronic component at a second location along the length of the first lead side as the electronic component is inserted in the testing device, with the second end portions of the first and second contacts extending along respective, intersecting axes.

13. The device according to claim 12 wherein the second end portions of the first and second contacts extend in a common plane which is generally parallel to a direction of insertion of an electronic component to be tested into the testing device.

14. The device according to claim 13 wherein the second end portion of at least one of the first and second contacts is angled with respect to the base plane.

15. The device according to claim 14 wherein the second end portion of each of the first and second contacts is angled with respect to the base plane.

16. The device according to claim 15 wherein the second end portion of the first contact is angled in a first direction relative to the base plane and the second end portion of the second contact is angled in a second direction, different from the first direction, relative to the base plane.

17. The device according to claim 16 wherein the second end portion of the second contact extends upwardly at a vertically acute angle.

18. The device according to claim 12 wherein the first end portion of the first contact is affixed atop the base and the second end portion of the second lead projects upwardly from below the first contact.

19. The device according to claim 18 further comprising, in combination: an alignment unit including an upstanding member formed with a central cut-out zone, with the upstanding member extending within the elongated slot to a height below the first end portion of the first contact, with a body of the electronic component being adapted to be received within the cut-out zone of the upstanding member upon insertion of the electronic component into the testing device.

20. The device according to claim 18 wherein the second end portion of the first contact slopes downward from the base.

21. The device according to claim 20 further comprising, in combination: a notch formed in the base into which the second end portion of the first contact extends.

22. The device according to claim 20 wherein the second end portion of the second contact projects upwardly above the second end portion of the first contact.

23. The device according to claim 12 wherein each lead includes a generally vertically extending first leg section and a terminal, generally horizontally extending second leg section, with the second end portion of the first contact being adapted to engage the second leg section of the lead and the second end portion of the second contact being adapted to engage the first leg section of the lead.

24. The device according to claim 12 wherein the base is formed from at least first and second base sections, with each of the first and second base sections having secured thereto a respective set of the first and second contacts, with the first base section being movable relative to the second base section to adjust a span between the respective sets of the first and second contacts.

25. A method of testing a miniature electronic component having multiple connection leads within a testing device including multiple pairs of first and second electrically isolated contacts mounted to a base of the testing device comprising, in combination: shifting the electronic component to cause a common underside of one of the multiple connection leads to electrically engage one pair of the first and second contacts at spaced longitudinal locations along a length of the lead.

* * * * *

UNITED STATES PATENT AND TRADEMARK OFFICE
CERTIFICATE OF CORRECTION

PATENT NO : 6,069,480

DATED : May 30, 2000

INVENTOR(S) : Farid J. Sabounchi et al.

It is certified that error appears in the above-identified patent and that said Letters Patent are hereby corrected as shown below:

Column 1, line 23, after "current" insert a period.

Column 4, line 59, cancel "arc" and substitute therefor -- are --.

Column 4, line 63, cancel "arc" and substitute therefor -- are --.

Column 5, line 42, cancel "10" and substitute therefor -- 110 --.

Signed and Sealed this

Eighth Day of May, 2001

*Attest:*

NICHOLAS P. GODICI

*Attesting Officer*   Acting Director of the United States Patent and Trademark Office